United States Patent
Dimauro et al.

(10) Patent No.: US 9,013,878 B2
(45) Date of Patent: Apr. 21, 2015

(54) ELECTRONIC SYSTEM FOR REFLOW SOLDERING

(71) Applicant: STMicroelectronics S.r.l., Agrate Brianza (MB) (IT)

(72) Inventors: Matteo Sebastiano Dimauro, Catania (IT); Sebastiano Russo, Catania (IT); Rosalba Cacciola, Tremestrieri Etneo (IT); Cristiano Gianluca Stella, San Gregorio di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 375 days.

(21) Appl. No.: 13/626,322

(22) Filed: Sep. 25, 2012

(65) Prior Publication Data

US 2013/0083489 A1  Apr. 4, 2013

(30) Foreign Application Priority Data

Sep. 30, 2011  (IT) .............................. MI2011A1776

(51) Int. Cl.
*H05K 7/20* (2006.01)
*H05K 1/11* (2006.01)
*H05K 3/34* (2006.01)

(52) U.S. Cl.
CPC ............. *H05K 1/111* (2013.01); *H05K 3/3431* (2013.01); *H05K 2201/09663* (2013.01); *H05K 2201/10166* (2013.01); *H05K 2201/10969* (2013.01); *H05K 2203/1178* (2013.01)

(58) Field of Classification Search
CPC .................... H05K 2203/1178; H05K 3/3494; H05K 2203/081
See application file for complete search history.

(56) References Cited

U.S. PATENT DOCUMENTS

| 5,842,275 | A  | * | 12/1998 | McMillan et al. | ............... 29/840 |
| 7,818,720 | B2 | * | 10/2010 | Gan et al. | ...................... 717/130 |
| 2003/0141103 | A1 | | 7/2003 | Ng et al. | |
| 2012/0012376 | A1 | * | 1/2012 | Li et al. | ......................... 174/261 |
| 2012/0106116 | A1 | * | 5/2012 | Nakagawa et al. | ........... 361/808 |

FOREIGN PATENT DOCUMENTS

JP    2006351926 A    12/2006

OTHER PUBLICATIONS

Italian Search Report and Written Opinion for IT MI2011A001776 mailed Jun. 12, 2012 (7 pages).

* cited by examiner

*Primary Examiner* — Gregory Thompson
(74) *Attorney, Agent, or Firm* — Gardere Wynne Sewell LLP

(57) ABSTRACT

An electronic system includes an insulating structural element with a coupling surface configured for coupling the electronic system with at least one further electronic system. The electronic system further includes at least one conducting contact element at least partially exposed on the coupling surface. Each conducting contact element has a soldering surface supporting reflow soldering of the conducting contact element with a corresponding further contact element of the further electronic system. In addition, each conducting contact element has at least one lateral surface protruding from the insulating structural element. The soldering surface of the conducting contact element includes at least one channel having an opened end at the protruding lateral surface, the channel configured to facilitate dispersion of waste gas produced during reflow soldering.

19 Claims, 4 Drawing Sheets

ELECTRONIC SYSTEM FOR REFLOW SOLDERING

PRIORITY CLAIM

This application claims priority from Italian Application for Patent No. MI2011A001776 filed Sep. 30, 2011, the disclosure of which is hereby incorporated by reference.

TECHNICAL FIELD

The solution according to one or more embodiments refers to the field of electronics. In more detail, the solution according to one or more embodiments relates to the reflow soldering of electronic complexes.

BACKGROUND

In the prior art several assembly processes for electronic equipments suitable for large-scale production have been developed. Basically, each assembly process provides for installing one or more electronic devices (e.g., of the Surface-Mounting Technology or SMT type) on an electronic board (e.g., a Printed Circuit Board or PCB).

Generally, each electronic device comprises a chip (or more) of semiconductor material on which a proper electronic component is integrated. The chip is enclosed in a package of insulating material in order to be isolated and protected from the outside environment. The package exposes conducting pins, which are coupled with corresponding conducting terminals of the chip. The pins are soldered to corresponding conducting pads formed on the electronic board. This allows the interaction between the electronic component, comprised in the electronic device, and other electronic devices, mounted on the electronic board in a similar way, through conducting tracks of the electronic board that properly connect the pads one another.

The soldering between the pins of the electronic devices and the pads of the electronic board should be performed homogenously for ensuring proper and/or with optimal performance operation of the electronic complex. At the same time, the soldering should provide a stable mechanical, electrical and thermal connection between the electronic devices and the electronic board.

A very common soldering technique is the reflow soldering. In this case, each electronic device is provisionally fixed to the electronic board using a solder paste (comprising adhesive elements), which is dispensed between the pins of the electronic device and the corresponding pads of the electronic board. Subsequently, the assembly thus obtained is heated for activating a flux comprised in the solder paste, which flux reacts with the metallic material of the tracks and pins thereby removing any oxidized layer thereof. The assembly is then heated up to melt a filler material of the solder paste. Finally, the assembly is cooled down thereby hardening the filler material.

Unfortunately, the chemical reactions of the adhesive elements and of the flux release waste gas that may be trapped in the solder paste during the cooling down thereof. After the hardening of the filler material, such waste gas forms cavities able to reduce a quality of the electrical coupling, of the mechanical coupling and (partially) of the thermal coupling between the pins and the pads. These cavities may reduce the operating efficiency of the electronic complex and generally reduce a useful life thereof.

A probability of entrapment of the waste gas (with the consequent formation of cavities) in the filler material is substantially proportional to an area of the soldering surface of the pins. Indeed, the greater the area of the soldering surface, the greater the chance that the waste gas originated at a central portion of the pin cannot reach an outer region of the filler material (corresponding to the perimeter of the pin) and be dispersed into the surrounding environment before the hardening of the filler material. In the case of SMT electronic devices with pins exposed on a mounting surface of the insulating body on the electronic board (configuration known as "No-Lead" or "Micro-lead"), the negative effect associated with the presence of such cavities is particularly pronounced in pins that are characterized by the passage of a major electric current flow and/or used as heat sinks.

SUMMARY

In general terms, the solution according to one or more embodiments is based on the idea of creating channels for facilitating the dispersion of the waste gas.

In particular, one or more aspects of the solution according to specific embodiments are set out in the independent claims, with advantageous features of the same solution that are set out in the dependent claims, whose wording is herein incorporated verbatim by reference (with any advantageous features provided with reference to a specific aspect of the solution according to an embodiment that apply mutatis mutandis at any other aspect thereof).

More specifically, an aspect of a solution according to an embodiment provides an electronic system (e.g., an SMT-type electronic device or an electronic board); the system is provided with one or more channels, which are sunken in a soldering surface of one or more of its contact elements (e.g., pins of the electronic device or pads of the electronic board) and are opened at one or more ends thereof in correspondence with at least one lateral surface of the contact element.

A further aspect of a solution according to an embodiment provides a corresponding electronic complex comprising at least one of these electronic systems.

Another aspect of a solution according to an embodiment provides a corresponding method for manufacturing an electronic complex comprising at least one of such electronic systems.

BRIEF DESCRIPTION OF THE DRAWINGS

A solution according to one or more embodiments, as well as additional features and its advantages will be better understood with reference to the following detailed description of an embodiment thereof, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated and/or simplified) and that, unless otherwise specified, they are simply intended to conceptually illustrate the structures and procedures described herein. In particular.

DETAILED DESCRIPTION OF THE DRAWINGS

Figure 1A:
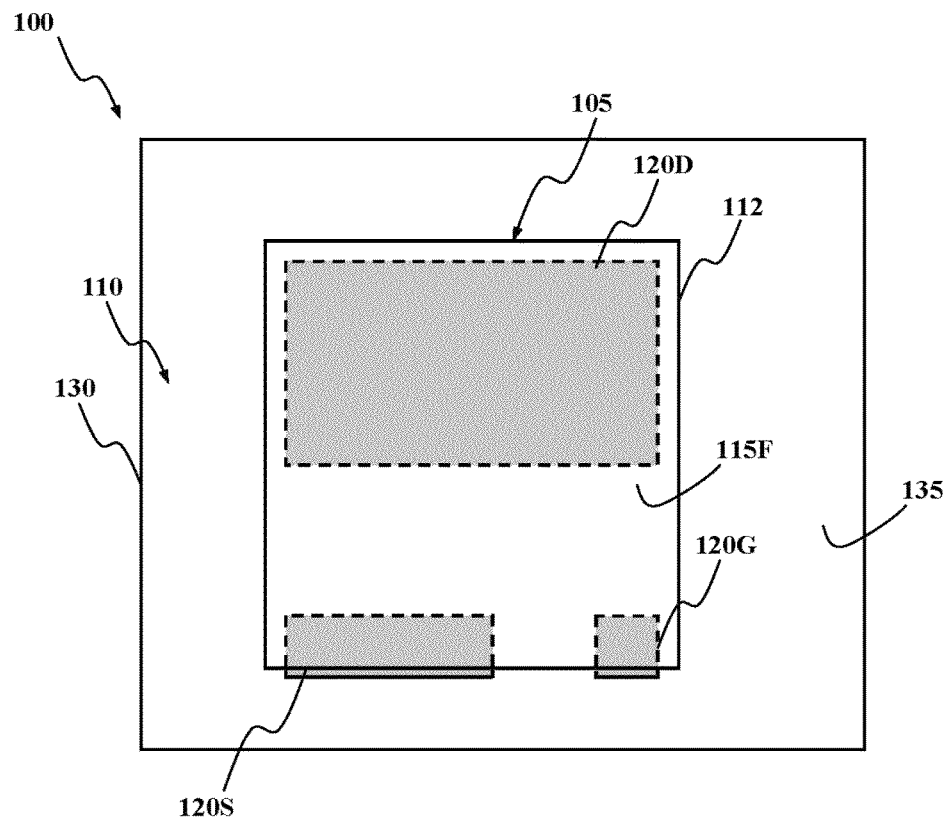
FIG. 1A illustrates a schematic plan view of an electronic complex in which the solution according to an embodiment may be applied.
Figure 1B:
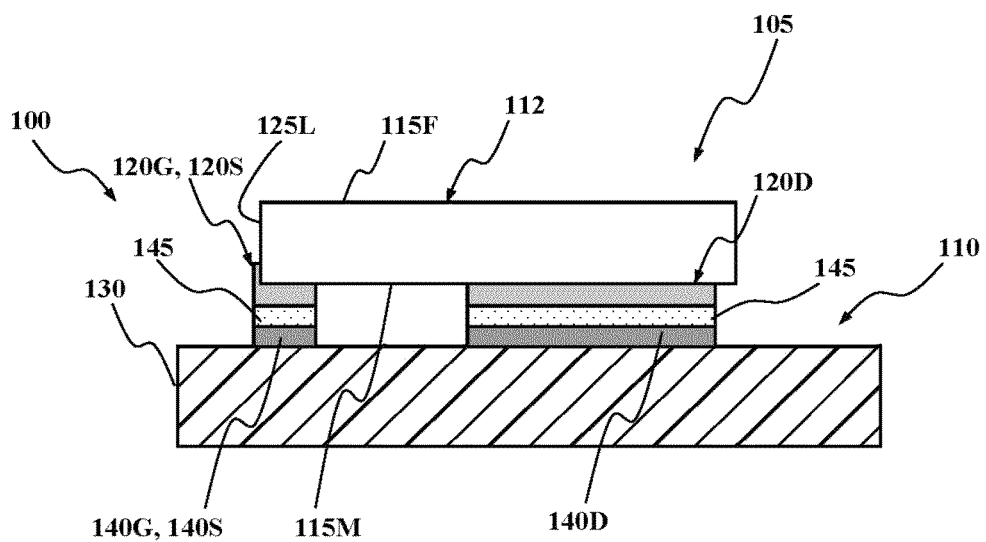
FIG. 1B illustrates a schematic side view of the electronic complex of FIG. 1.

With particular reference to FIGS. 1A and 1B together, they illustrate a plan view and a side view, respectively, of an electronic complex 100 in which the solution according to an embodiment may be applied.

In more detail, the electronic complex 100 comprises an electronic device 105 (or more) and an electronic board 110.

In the example at issue, the electronic device 105 is of the No-Lead (or Micro-Lead) SMT type. In particular, the electronic device 105 comprises a package 112 made of an insulating material (e.g., plastic or ceramic); the package 112 is substantially parallelepiped-shaped with two main surfaces, i.e., a mounting surface 115M (for mounting on the electronic board 110) and a free surface 115F opposed thereto. The package 112 houses a chip (or more) of semiconductor material within it, not visible in the figures, on which an electronic component is integrated—from a single element, e.g., a transistor, to a complete circuit, e.g., a central processing unit.

In order to make an electrical path between the chip and elements being external to the electronic device 105—thereby allowing connecting the electronic component to other electronic components, not shown in the figures—the package 112 comprises a plurality of conducting pins, such as a source pin 120S, a gate pin 120G and a drain pin 120D in the example at issue; each of the pins 120S, 120G, 120D is electrically connected to corresponding terminals of the chip (e.g., by connecting wires, or "wire bonding" in the jargon, comprised inside the package 112, not shown in the figures). For example, the pin 120D is connected to a drain terminal, the pin 120S is connected to a source terminal and the pin 120G is connected to a gate terminal of a power MOS transistor integrated on the chip.

The pins 120S, 120G are generally rectangular-shaped, and extend partially on the mounting surface 115M and partially on a side surface 125L of the package 112. Conversely, the pin 120D is fully exposed on the mounting surface 115M with a generally rectangular shape, and covers about half of the mounting surface 115M; the pin 120D also acts as a heat sink for transferring (in operation) the heat from the chip, mounted thereon, to the electronic board 110.

The electronic board 110 consists of a PCB having an insulating substrate 130 formed in an insulating material (e.g., FR-4 comprising fiberglass and epoxy resin). The substrate 130 is provided with a mounting surface 135 for supporting the electronic device 105 (and possibly other electronic devices not shown in the figures). On the mounting surface 135, a plurality of pads 140 in conducting material (e.g., copper Cu) are formed, in the example at issue a gate pad 140G, a source pad 140S (behind the pad 140G in FIG. 1B) and a drain pad 140D, on which the pin 120G, the pin 120S and the pin 120D, respectively, are soldered.

Typically, the electronic board 110 also comprises conducting tracks (not shown in the figures for the sake of simplicity) that connect the pads 140G, 140S, 140D to one another for making electrical connections between the electronic devices mounted on the electronic board 110.

The electronic complex 100 is formed by reflow soldering the electronic device 105 on the electronic board 110.

In particular, a solder paste 145 is dispensed on the pads 140G, 140S, 140D; such solder paste 145 generally comprises adhesive elements, a flux and a filler material.

Subsequently, the electronic device 105 is positioned on the electronic board 110 so that each pin 120G, 120S and 120D is placed over the pad 140G, 140S and 140D, respectively. The electronic device 105 is temporarily bound to the electronic board 110 thanks to the adhesive elements in the solder paste that covers the pads 140G, 140S, 140D.

At this point, the assembly thus obtained is heated to a first temperature in order to activate the flux, which reacts with the metallic material of the pads 140G, 140S, 140D and of the pins 120G, 120S, 120D chemically thereby removing any oxidized layer therefrom. Thanks to this chemical reaction, a wetting of the pins 120G, 120S, 120D and of the pads 140G, 140S, 140D by the (molten) filler material is substantially improved.

After that, the filler material is melted by heating the assembly to a second temperature (higher than the first temperature). In this way, the molten filler material binds to both the pins 120G, 120S, 120D and the pads 140G, 140S, 140D.

Finally, the assembly is cooled down, so that the filler material hardens and forms a definitive electrical, mechanical and thermal coupling between the pins 120G, 120S, 120D and the pads 140G, 140S, 140D, in order to obtain the electronic assembly 100.

As indicated above, the chemical reactions occurring between the solder paste, the pins 120G, 120S, 120D and the pads 140G, 140S, 140D—in particular, the reactions associated with the flux and activated by the heating—cause the generation of waste gas that moves due to thermal agitation within the solder paste made fluid by heating. Such waste gas may remain trapped within the solder paste, once the latter has cooled down, thereby forming cavities (not shown in the figures).

Figure 2A:
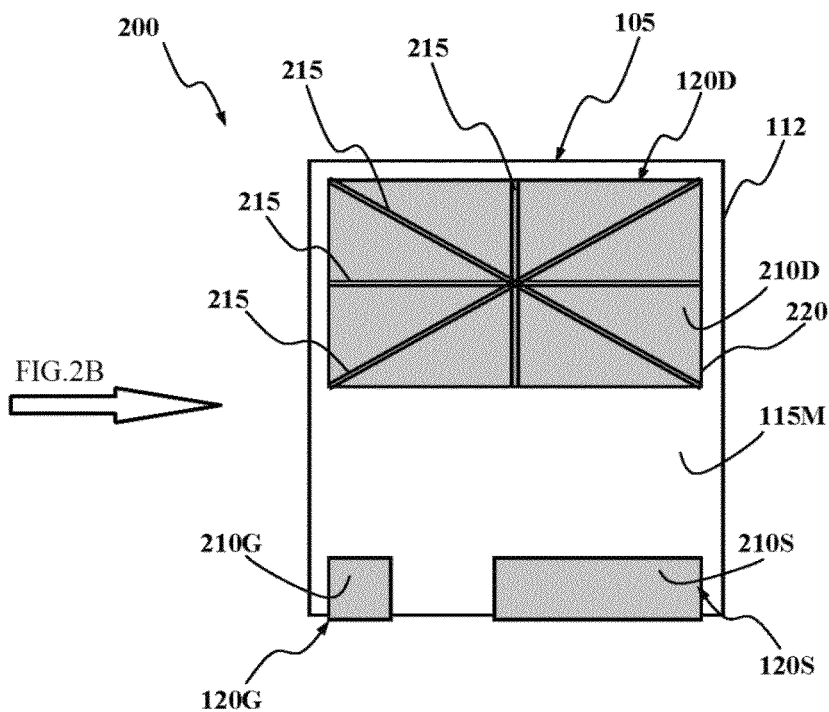
FIG. 2A illustrates a schematic plan view from below of an electronic device according to an embodiment.
Figure 2B:
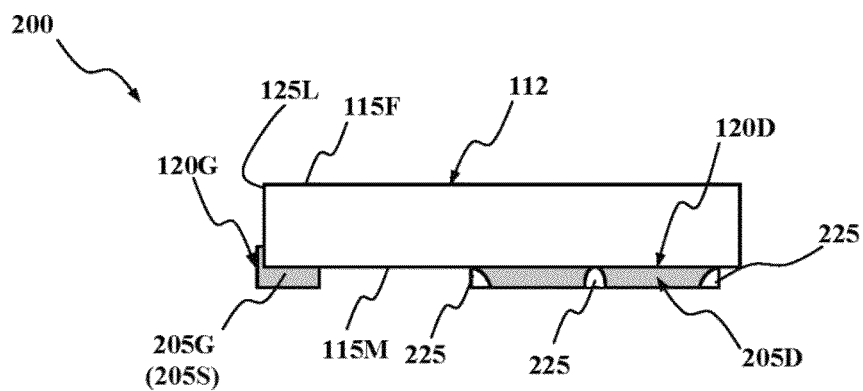
FIG. 2B illustrates a schematic side view of the electronic device of FIG. 2.

With joint reference to FIGS. 2A and 2B, an electronic device 200 will now be described according to an embodiment, of which a plan view from the bottom and a side view, respectively, are shown.

Each pin 120S, 120G, 120D protrudes beyond the mounting surface 115M of the package 112, thereby exposing a respective lateral surface 205S, 205G, 205D and a respective soldering surface 210S, 210G, 210D parallel to the mounting surface 115M.

In the solution according to an embodiment, one or more of the pins 120S, 120G, 120D comprises at least one channel 215 being sunken in the soldering surface 210S, 210G, 210D, which channel has at least one opening 225 defined by an opened end thereof at the respective lateral surface 205S, 205G, 205D for facilitating the dispersion of the waste gas of the reflow soldering (as described in detail below); for example, in the specific embodiment shown in the figures, the pin 120D comprises four channels 215 being sunken in the soldering surface 210D, which channels cross it completely along diagonals and axes thereof in such a way that each has two opposite openings 225. Such channels 215 may be made in any way known in the art, for example, by mechanically or chemically etching the soldering surface 210D. The channels 215 are preferably, although without limitation, etched in a such a way as to have a depth equal to a height of the exposed lateral surface 205 with respect to the mounting surface 115M of the package 112.

Figure 3A:
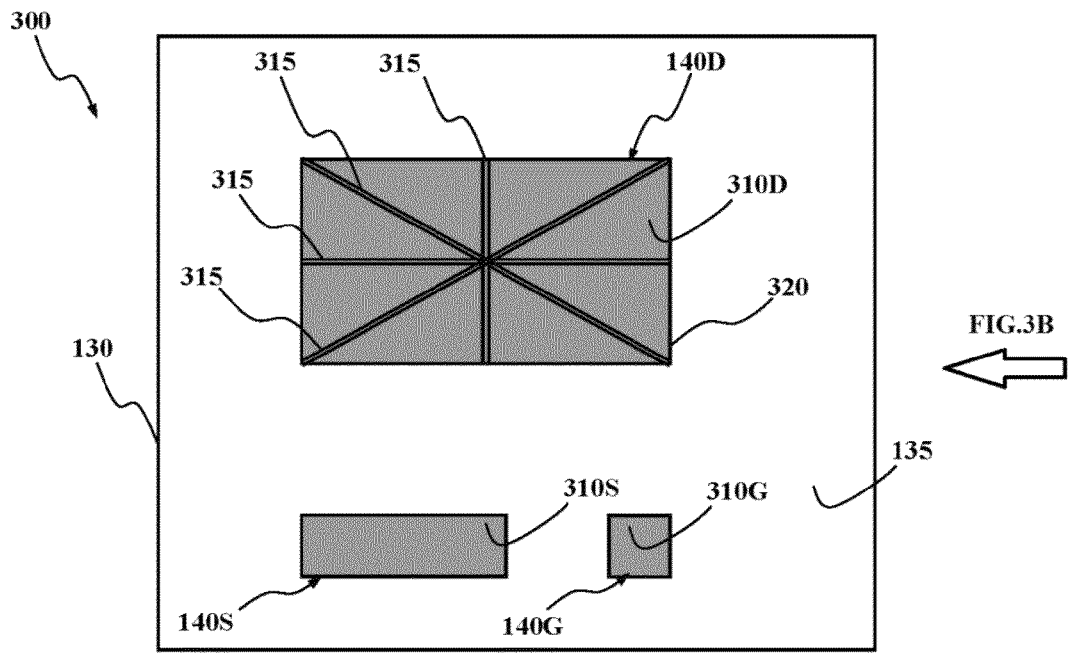
FIG. 3A illustrates a schematic plan view of a portion of the electronic board according to an embodiment.
Figure 3B:
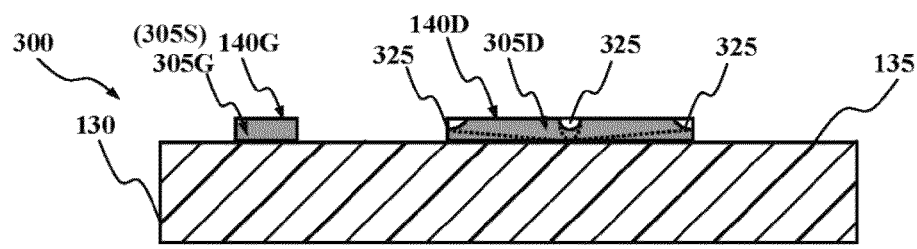
FIG. 3B illustrates a schematic side view of a portion of the electronic board of FIG. 3.

Considering FIG. 3A together with FIG. 3B, a portion of an electronic board 300 according to an embodiment will now be described, illustrated in plan and lateral schematic views, respectively.

As above, each pad 140S, 140G, 140D protrudes beyond the mounting surface 135 of the insulating substrate 130, thereby exposing a respective lateral surface 305S, 305G, 305D and a respective soldering surface 310S, 310G, 310D parallel to the mounting surface 135.

In the solution according to an embodiment, one or more of the pads 140S, 140G, 140D comprises at least one channel 315 being sunken in the soldering surface 310S, 310G, 310D, which channel has at least one opening 325 defined by its opened end at the respective lateral surface 305S, 305G, 305D for facilitating the dispersion of the waste gas of the reflow soldering (as described in detail below); for example, in the specific embodiment shown in the figures, the pad 140D comprises four channels 315 sunken in the soldering surface 310D, which channels completely cross it along diagonals and axes thereof in such way that each has two opposite openings 325. Again, such channels 315 may be made in any way known in the art, for example, by mechanically or chemically etching the soldering surface 310D.

The channels 315 are preferably, although without limitation, etched in such a way to have a decreasing depth from a maximum value at the center of the pad 140D to a minimum value at the lateral surface 305D of the pad 140D; for example, each channel 315 may be formed with a depth of value equal to the height of the lateral surface 305 at the center of the pad 140D, which depth decreases in a linear way down to a value equal to or lower than half the height of the lateral surface 305 at the lateral surface 305D of the pad 140D (and then of the openings 325 exposed thereon). In this way, the openings 325 are spaced apart from the mounting surface 135 of the electronic board 300, thereby preventing the solder paste in the channels 315 (not shown) to form drips or smudges on the mounting surface 135 at an early stage of the solder paste deposition on the soldering surface 310D.

Figure 4:
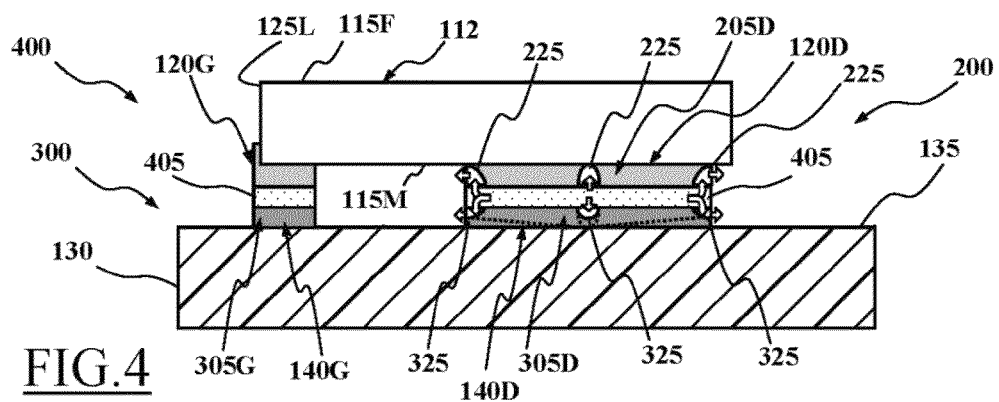
FIG. 4 illustrates a schematic side view of an electronic complex according to an embodiment comprising the electronic device of FIGS. 2A and 2B and the electronic board of FIGS. 3A and 3B.

Turning now to FIG. 4, a lateral view of an electronic complex 400 according to an embodiment is illustrated comprising the electronic device 200 and the electronic board 300 (coupled one another).

In this case, thanks to the channels 215 and 315 formed in the pin 120D of the electronic device 200 and in the corresponding pad 140D of the electronic board 300, respectively, the waste gas remains no longer trapped—or at least remains trapped to a much lower extent—within the solder paste 305 between the pin 120D and the pad 140D.

Indeed, the waste gas may easily reach the channels 315 and 215 even at a central portion of the pad 140D and of the pin 120D. The waste gas is thus able to disperse quickly in the environment outside the electronic complex 400 running through the channels 315 and/or 215 until escaping into the outside environment via the openings 325 and 225 formed on the lateral surface 305D of the pad 140D and on the lateral surface 205D of the pin 120D, respectively (as schematically shown in the figure by corresponding arrows). In this way, the channels 315 and 215 provide an escape route for the waste gas generated during the reflow soldering.

Thanks to the above described solution it is possible to obtain a contact between the pin 120D and the corresponding pad 140D without, or at least with a small number of, cavities caused by the entrapment of the waste gas generated during the reflow soldering. Consequently, the electronic device 200 is mounted with good mechanical stability on the electronic board 300, and the contact between the pin 120D and the pad 140D has a high electrical and thermal conductivity. This increases the operation efficiency of the electronic complex 400 and generally prolongs its useful life.

In a further embodiment (not shown in the figures) there is provided for forming an electronic complex coupling one or more electronic devices according to an embodiment (e.g., the electronic device 200 described in relation to FIGS. 2A and 2B) with an electronic board of a known type (for example, the electronic board 110 described in relation to FIGS. 1A and 1B). In a still further embodiment (not shown in the figures) there is provided for forming an electronic complex coupling one or more electronic devices of a known type (for example, the electronic device 105 described in relation to FIGS. 1A and 1B) with an electronic board according to an embodiment (e.g., the electronic board 300 described in relation to FIGS. 3A and 3B).

Even in such cases the presence of channels (now only on the pins of the electronic devices, or on the pads of the electronic board, respectively) facilitates the escape of the waste gas during the reflow soldering (albeit in smaller amounts).

In the FIGS. 5A-5G, plan views are illustrated of the soldering surface (generally indicated by the reference 510) of a pad of an electronic board and/or of a pin of an electronic device according to various embodiments.

Figure 5A:
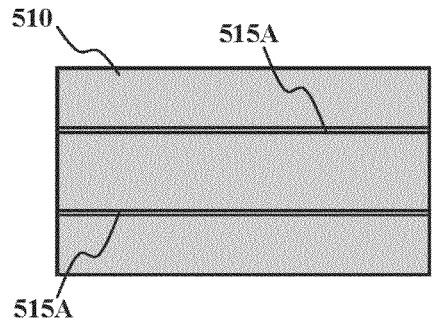
FIGS. 5A-5G illustrate plan views of the soldering surface of a pad of an electronic board and/or of a pin of an electronic device according to various embodiments.

In particular, in FIG. 5A the soldering surface 510 comprises two channels 515A that extend between two opposite borders thereof (in parallel to its longest borders).

Figure 5B:
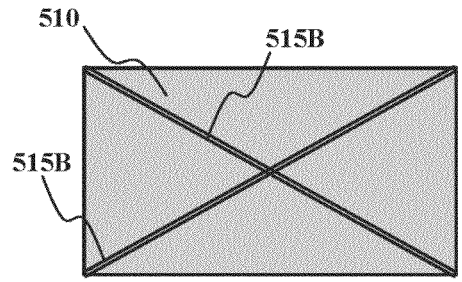

In FIG. 5B the soldering surface 510 comprises two channels 515B that extend along the diagonals thereof (between corresponding opposite edges).

Figure 5C:
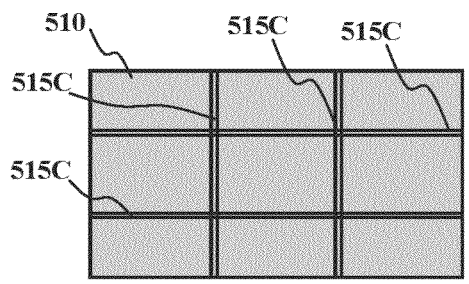

In FIG. 5C the soldering surface 510 comprises four channels 515C, grouped in two pairs of parallel channels 515C, perpendicular to each other; in particular, two channels 515C extend between the two shorter borders and two channels 515C extend between the two longest borders of the soldering surface 510 (parallel to its longest borders and to its shorter borders, respectively).

Figure 5D:
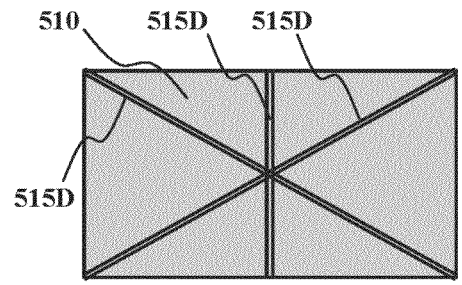

In FIG. 5D the soldering surface 510 comprises three channels 515D, which extend along the diagonals (between corresponding opposite edges) and along a symmetry axis (parallel to the shorter borders) of the soldering surface 510.

Figure 5E:
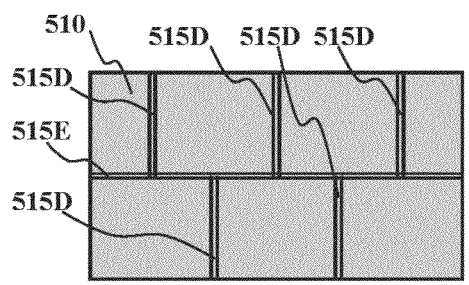

In FIG. 5E the soldering surface 510 comprises a channel 515E that extends along a symmetry axis thereof (parallel to the longest borders), and further channels 515D that extend perpendicularly from it (in a staggered manner with respect to one another) up to an upper longest border and to a lower longest border of the soldering surface 510.

Figure 5F:
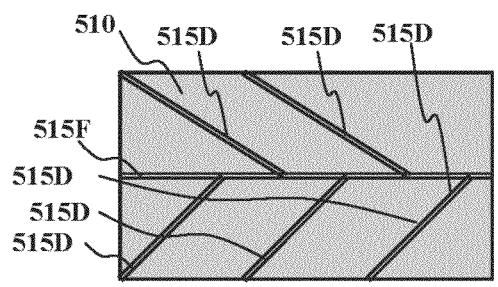

In FIG. 5F the soldering surface 510 comprises a channel 515F that extends along a symmetry axis thereof (parallel to the longest borders), and further channels 515D that extend from it in a herringbone-like manner (sloped and staggered with respect to one another) up to an upper longest border and to a lower longest border of the soldering surface 510.

Figure 5G:
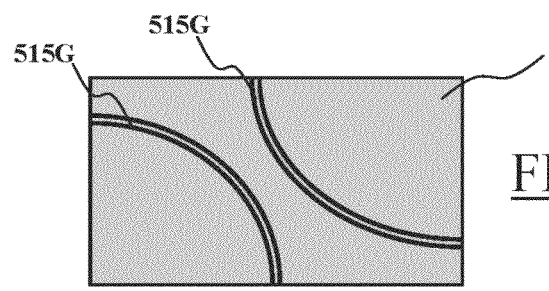

In FIG. 5G the soldering surface 510 comprises two channels 515G, each of which extends in an arc-like shape between two adjacent borders thereof.

It is to be noted that, also in this case, when the channels are formed in the pads of the electronic board, preferably, although without limitation, they may have a depth increasing towards the inside of the pad.

It is important to note that, in an electronic complex comprising an electronic board and one or more electronic devices according to various embodiments, the channels provided on the pads and on the corresponding pins need not to extend along matching directions with respect to one another (in such a way to overlap one another when the electronic devices are coupled with the electronic board). For example, a pin may comprise channels extending along the diagonals of the soldering surface thereof, while the corresponding pad may comprise channels extending along the symmetry axes of the soldering surface thereof.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, the terms including, comprising, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly otherwise stated).

For example, an aspect of the solution according to an embodiment proposes an electronic system (such as an electronic device or an electronic board). Similar considerations apply if the system has a different structure or comprises equivalent components (e.g., made in other materials and/or other forms), or has other operating characteristics. In any case, any component may be separated into more elements, or two or more components may be combined into a single element; in addition, each component may be replicated to support the execution of the corresponding operations in parallel. It should also be noted that (unless stated otherwise) any interaction between different components usually does not need to be continuous, and may be both direct and indirect through one or more intermediaries.

The system comprises an insulating structural element (such as an insulating body of the electronic device that encloses at least one chip on which at least one electronic component is integrated or an insulating substrate of the electronic board for supporting said at least one electronic device), which has a coupling surface for coupling the electronic system with at least one further electronic system (such as a mounting surface for mounting the electronic device on an electronic board or for mounting at least one electronic device on the electronic board). At least one conducting contact element (like a conducting pin of the electronic device or a conducting pad of the electronic board) is exposed at least partly on the coupling surface (i.e., it is exposed in whole or in part). Each contact element comprises a soldering surface for reflow soldering the contact element with a corresponding further contact element of the further electronic system, and it has at least one lateral surface protruding from the structural element (e.g., when it protrudes from the mounting surface as described above, or even when it is flush with the mounting surface with a portion exposed from the lateral surface of the structural insulation element).

In the solution according to an embodiment, the contact element comprises at least one channel being sunken in the soldering surface (with the channels that may be in any number as long as the electrical conductivity of the electrical contact between pin and pad is not overly reduced). Each channel has at least one opened end at said at least one lateral surface of the contact element for facilitating the dispersion of waste gas of the reflow soldering.

In an embodiment, the electronic system is an electronic device of surface-mounting type or an electronic board; in any case, nothing prevents applying the same solution to other types of electronic devices, or more generally to other electronic systems (such as a flexible interconnection cable).

In an embodiment, the pin comprises a heat sink (with said at least one chip that is mounted on the heat sink); the same solution may also be applied to different and/or further pins (up to all the pins of the electronic device).

In an embodiment, a channel (or more) of a conducting pad (or more) of the electronic board is sunken to a depth increasing from the soldering surface moving toward the inside of the pad. In any case, nothing prevents making the channel even with a different depth (e.g., with a maximum depth greater or smaller than the height of the contact element) or varying the depth between different values and/or in a different way (also non-linearly); moreover, it is not excluded the possibility of making even one or more of the channels of the electronic device with variable depth, or vice-versa making all the channels of the electronic board with uniform depth.

In an embodiment, each channel has a plurality of ends; each end is opened at said at least one protruding lateral surface of the contact element. Alternatively, the channels may branch with multiple openings, or may have one or more closed ends.

In an embodiment, at least one channel extends along a diagonal of the soldering surface of the contact element.

In an embodiment, at least one channel extends between two opposite border portions of the soldering surface.

In an embodiment, at least one channel extends along a symmetry axis of the soldering surface.

As described above, such arrangements of the channels may be combined in any way; moreover, also alternative and/or additional channel arrangements may be provided.

Another aspect of the solution according to an embodiment provides an electronic complex comprising at least one electronic board as described above and/or at least one electronic device as described above, which is mounted on said at least one electronic board.

It is apparent that the proposed electronic board and electronic devices may be made and marketed also as separate products. In contrast, the proposed electronic board, electronic devices and electronic system may be coupled with one or more other components, or may be assembled into intermediate products (such as motherboards); in any case, such components are adapted to be used in complex structures (such as mobile phones).

Another aspect of the solution according to an embodiment proposes a method for manufacturing an electronic complex. The method comprises the steps of providing an electronic system (which comprises an insulating structural element), coupling a coupling surface of the structural element with at least one further electronic system, and reflow soldering at least one conducting contact element (at least partly exposed on the coupling surface) with a corresponding further contact element of the further electronic system (with the contact element having at least one lateral surface protruding from the structural element). In the solution according to an embodiment, the method further comprises providing the contact element with at least one channel being sunken in the soldering surface, with each channel having at least one opened end at said at least one lateral surface of the contact element for facilitating the dispersion of waste gas of the reflow soldering.

Similar considerations apply if the same solution is implemented with an equivalent process (using similar steps with the same functions of more steps or portions thereof, removing some unessential steps, or adding further optional steps); moreover, the steps may be performed in different order, in parallel or overlapped (at least in part).

What is claimed is:

1. An apparatus, comprising:
    a structural insulating element having a coupling surface configured to support coupling to an electronic system,
    at least one conducting contact element at least partly exposed on the coupling surface, the at least one conducting contact element comprising a soldering surface configured to support reflow soldering of the at least one conducting contact element to the electronic system and having at least one lateral surface protruding from the structural insulating element,
    wherein the at least one conducting contact element comprises at least one channel being sunken into the soldering surface, the at least one channel having at least one opened end at said at least one lateral surface, said at least one channel configured to facilitate a dispersion of waste gas of the reflow soldering, and the at least one channel having a varying depth from the soldering surface moving inwardly from the lateral surface.

2. The apparatus according to claim 1, wherein the structural insulating element is an insulating body of an integrated circuit device, the at least one conducting contact element is a conducting pin of the integrated circuit device, and the electronic system is an electronic board to which the integrated circuit device is mounted.

3. The apparatus according to claim 1, wherein the structural insulating element is an electronic board, the at least one conducting contact element is a conducting pad of the electronic board, and the electronic system an integrated circuit device mounted to the electronic board.

4. The apparatus according to claim 2, wherein the conducting pin comprises a heat sink, said integrated circuit device including at least one chip mounted on the heat sink.

5. The apparatus according to claim 1, wherein the varying depth increases moving inwardly from the protruding lateral surface.

6. The apparatus according to claim 1, wherein the at least one channel has a plurality of ends, each end being open at one of said at least one lateral surface.

7. The apparatus according to claim 1, wherein the at least one channel extends along a diagonal of the soldering surface.

8. The apparatus according to claim 1, wherein the at least one channel extends between two lateral surfaces protruding from the structural insulating element.

9. The apparatus according to claim 1, wherein the at least one channel extends along a symmetry axis of the soldering surface.

10. An apparatus, comprising:
    an electronic board having a first coupling surface and a conducting pad at least partly exposed on the first coupling surface, said conducting pad having a first soldering surface;
    an electronic device having a second coupling surface and a conducting pin at least partly exposed on the second coupling surface, said conducting pin having a second soldering surface;
    where at least one of the first soldering surface and second soldering surface is configured to support reflow soldering by including at least one channel sunk into said at least one of the first soldering surface and the second soldering surface, said at least one channel extending inwardly from an opened end at a protruding lateral surface of the at least one of the first soldering surface and the second soldering surface, and the at least one channel having a varying depth moving inwardly from the protruding lateral surface.

11. The apparatus of claim 10, wherein the at least one channel extends from a first opened end at a first protruding lateral surface to a second opened end at a second protruding lateral surface.

12. The apparatus of claim 11, wherein the at least one channel is straight.

13. The apparatus of claim 11, wherein the at least one channel is curved.

14. The apparatus of claim 11, wherein the at least one channel comprises two channels which intersect each other.

15. The apparatus according to claim 11, wherein the varying depth increases in a direction moving inwardly from the protruding lateral surface.

16. A method, comprising the steps of:
    coupling a coupling surface of an insulating structural element of an electric system with a further electronic system,
    providing a soldering surface of a conducting contact element at least partially exposed on the coupling surface with at least one channel being sunk into the soldering surface, the at least one channel having at least one opened end at a lateral surface of the conducting contact element, the at least one channel having a varying depth from the soldering surface moving inwardly from the lateral surface, and
    reflow soldering the conducting contact element with a corresponding further contact element of the further electronic system.

17. An apparatus, comprising:
    a soldering contact for an electronic device,
    wherein the soldering contact comprises a soldering surface and a protruding lateral surface, and
    wherein the soldering surface includes at least one channel sunk into the soldering surface, said channel having at least one end opening in the protruding lateral surface, the at least one channel having a varying depth from the soldering surface moving inwardly from the protruding lateral surface.

18. The apparatus according to claim 17, wherein the varying depth increases in a direction moving inwardly from the protruding lateral surface.

19. The apparatus of claim 17, wherein the at least one channel extends across the soldering surface from a first end opening in a first protruding lateral surface of the soldering surface to a second end opening in a second protruding lateral surface of the soldering surface.

* * * * *